United States Patent
Yoshino

(10) Patent No.: US 8,030,180 B2
(45) Date of Patent: Oct. 4, 2011

(54) METHOD OF MANUFACTURING A SEMICONDUCTOR DEVICE

(75) Inventor: Kazumori Yoshino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/073,200

(22) Filed: Mar. 3, 2008

(65) Prior Publication Data

US 2008/0227234 A1    Sep. 18, 2008

(30) Foreign Application Priority Data

Mar. 13, 2007   (JP) ................. 2007-063373

(51) Int. Cl.
*H01L 21/00* (2006.01)
(52) U.S. Cl. .................... 438/462; 438/33; 257/620
(58) Field of Classification Search .......... 438/33, 438/462; 257/620
See application file for complete search history.

(56) References Cited

U.S. PATENT DOCUMENTS

2004/0072386 A1*   4/2004   Tanabe et al. ............. 438/68
2008/0191318 A1*   8/2008   Su et al. .................. 257/620

FOREIGN PATENT DOCUMENTS

| JP | 2001-308036 | 11/2001 |
| JP | 2002-16264 | 1/2002 |
| JP | 2005-349486 | 12/2005 |
| JP | 2006-29827 | 2/2006 |
| JP | 2006-32716 | 2/2006 |
| JP | 2006-062002 | 3/2006 |

* cited by examiner

*Primary Examiner* — Douglas Menz
(74) *Attorney, Agent, or Firm* — Rabin & Berdo, PC

(57) ABSTRACT

A semiconductor device is manufactured in a silicon-on-insulator (SOI) wafer having an silicon active layer, a buried oxide layer, and a supporting substrate layer. Before the wafer is diced into chips along scribe lines, the silicon active layer is selectively etched to form trenches surrounding the scribe lines. The wafer is then diced using a dicing apparatus having a blade width smaller than the width of the trenches. The dicing blade accordingly does not make contact with the silicon active layer, which is particularly vulnerable to chipping.

6 Claims, 5 Drawing Sheets

METHOD OF MANUFACTURING A SEMICONDUCTOR DEVICE

BACKGROUND OF THE INVENTION

1. Field of the Invention

The present invention relates to a method of dicing a semiconductor substrate into, for example, microelectromechanical system (MEMS) chips.

2. Description of the Related Art

MEMS chips are generally diced from a silicon wafer by a dicing apparatus with a saw that cuts along a predetermined grid of scribe lines. The silicon wafer, which may be only a few hundred micrometers (μm) thick, is first taped with UV tape (a type of adhesive tape that loses adhesion on exposure to ultraviolet light). The dicing saw has a thin blade coated with diamond particles, which are harder than silicon. The diamond particles are held in a metal bonding material electro-deposited on the surface of the blade.

In an alternate method for use in dicing MEMS chips formed in a silicon-on-insulator (SOI) wafer, the supporting substrate layer of the wafer is etched away below the scribe lines; then the overlying oxide insulator film and silicon active layer are cut along the scribe lines with a laser beam, as disclosed in Japanese Patent Application Publication No. 2006-62002 (FIGS. 3 and 4 on pages 6 to 7).

In the general dicing method, the cutting speed and direction (up-cut or down-cut) are optimized to prevent chipping of the silicon material, and the blade is dressed at regular intervals, before significant blade wear develops, so that the diamond particles will not fall out and clog the kerf, where they can cause severe chipping.

These measures are, however, inadequate to prevent chipping in the dicing of wafers with specific surface orientations often required for MEMS products. For example, chipping has been found to occur in the dicing of bonded SOI wafers having a (100) silicon supporting layer several hundred micrometers thick and a (110) silicon active layer several micrometers thick, in which the crystal lattice orientations at the surfaces of the active layer and the supporting layer differ by 45 degrees. In this configuration, the thin silicon active layer is especially prone to chipping during dicing.

In a piezoresistive MEMS acceleration sensor of the type partly shown in FIG. 2, a resulting problem is that silicon flakes 71 that have chipped off may remain inside the sensor, in the gap 65 between the mass 22 and stopper 41a, for example, where they reduce the movable range of the mass or immobilize the mass, so that the sensor cannot operate properly or cannot operate at all.

A problem with the laser dicing method described above is that the MEMS design is constrained by the need to etch trenches in the supporting substrate layer below the scribe lines during the process of forming the MEMS structure.

SUMMARY OF THE INVENTION

A general object of the present invention is to reduce defects caused by dicing of SOI wafers.

A more particular object is to reduce malfunctions of MEMS devices due to chipping caused by dicing cuts.

The invention provides a method of manufacturing a semiconductor device in an SOI wafer having a silicon active layer, a buried oxide layer, and a supporting substrate layer. The method includes:

selectively etching the silicon active layer to form a trench having a predetermined width surrounding a scribe line; and cutting the supporting substrate layer along the scribe line by use of a dicing apparatus having a blade width smaller than the predetermined width.

These steps ensure that during the dicing cut, the dicing blade does not make contact with the silicon active layer, which is particularly vulnerable to chipping. The invention accordingly reduces the occurrence of chipping and the occurrence of consequent malfunctions.

DETAILED DESCRIPTION OF THE INVENTION

Figure 1:
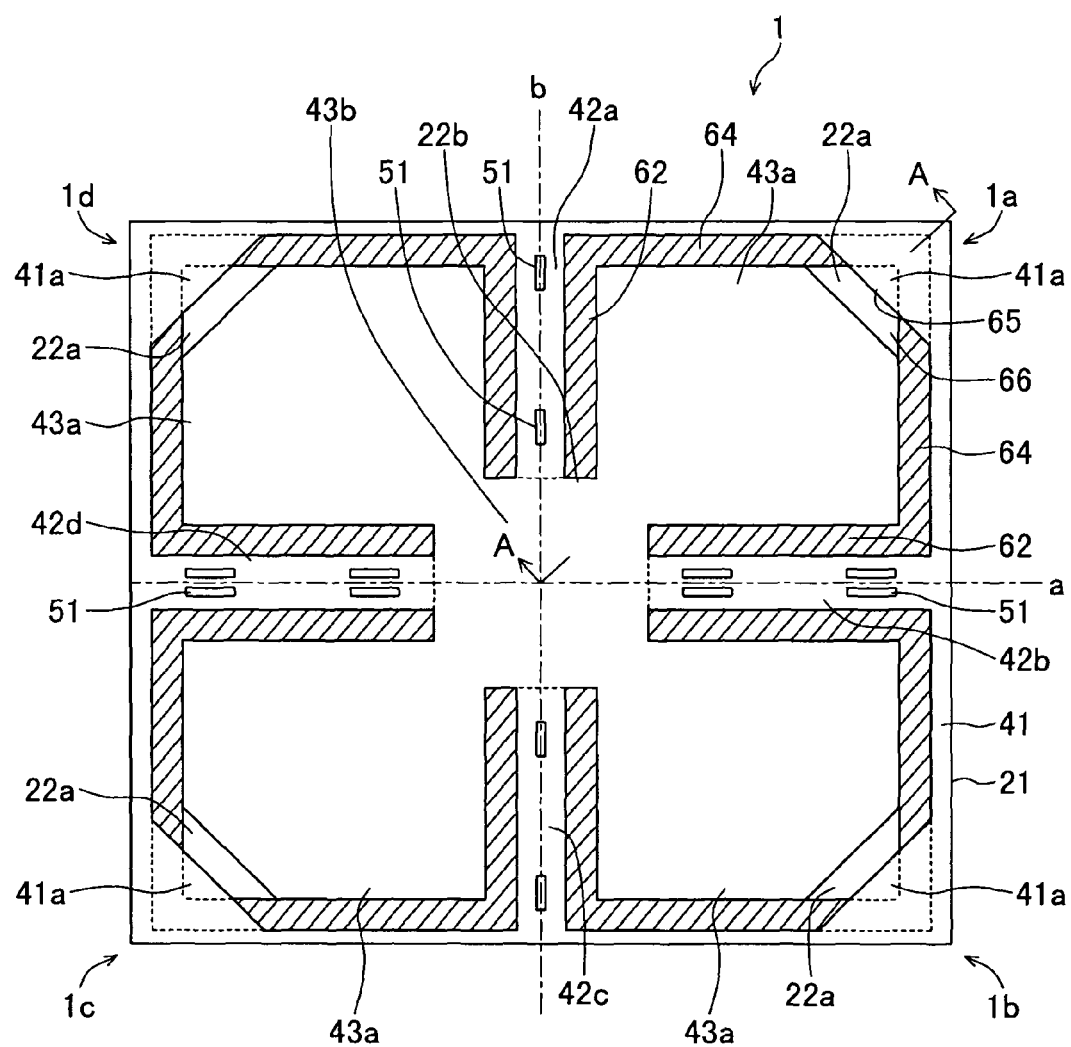
FIG. 1 is a plan view of a piezoresistive MEMS acceleration sensor chip manufactured in an SOI wafer.

An embodiment of the invention will now be described with reference to the attached drawings, in which like elements are indicated by like reference characters.

First Embodiment

A method of manufacturing the piezoresistive acceleration sensor shown in FIGS. 1 and 2 will be described with reference to FIG. 3 to FIG. 10.

Figure 3:
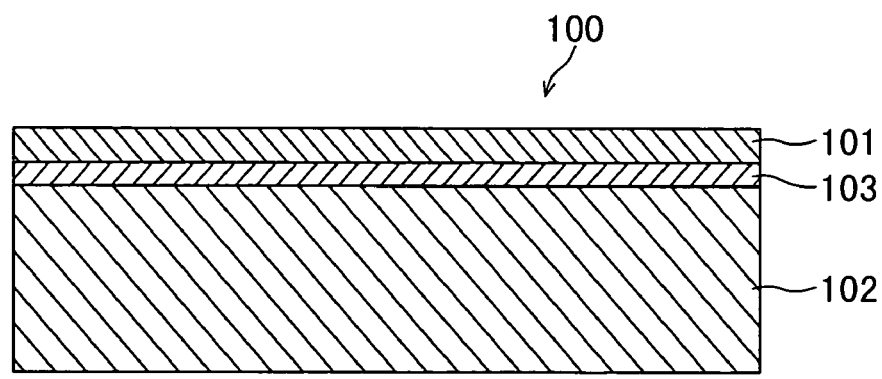
FIG. 3 illustrates the structure of the SOI wafer.

Referring to FIG. 3, a plurality of acceleration sensors are manufactured simultaneously from a known SIO wafer 100 comprising an active layer 101 (a silicon layer), a supporting layer 102 (another silicon layer) and a buried oxide (BOX) layer 103 of $SiO_2$ sandwiched between the silicon layers 101, 102. The supporting layer 102 has a (100) surface orientation. The active layer 101 has a (110) surface orientation, rotated by 45 degrees with respect to the (100) orientation of the supporting layer 102.

Figure 2:
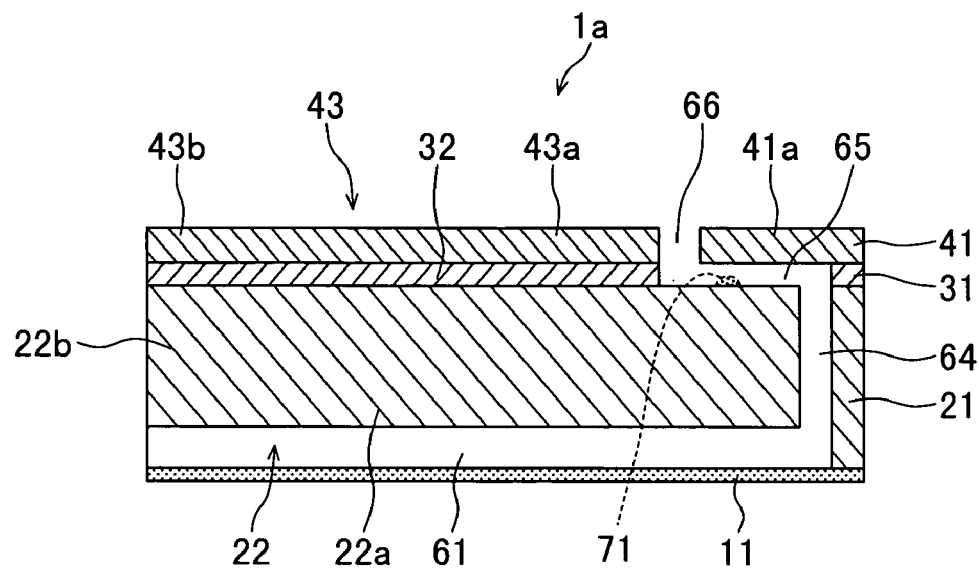
FIG. 2 is a partial schematic sectional view of the MEMS acceleration sensor through line A-A FIG. 1.

The piezoresistive acceleration sensor 1 in FIGS. 1 and 2 is one of a plurality of identical MEMS devices that are formed in the SOI substrate by known processes for fabricating electrical and mechanical components, and are then separated from each other by the novel dicing procedure described below. As shown in FIG. 1, the piezoresistive acceleration sensor 1 has a known structure comprising four regions, 1a, 1b, 1c, 1d that are mutually symmetrical with respect to a pair of orthogonal lines a, b. The following description will focus on the 1a region, with reference to the sectional view in FIG. 2.

As shown in FIG. 2, the piezoresistive acceleration sensor 1 comprises a glass base 11, and a housing 21 and mass 22 formed from the supporting silicon layer 102 in FIG. 3. The piezoresistive acceleration sensor 1 also comprises oxide films 31, 32 (FIG. 2) formed from the BOX layer 103 (FIG. 3), and a peripheral frame 41, four beams 42a-42d, and a mass attachment section 43 (FIGS. 1 and 2) formed from the active layer 101 (FIG. 3). Piezoelectric resistive elements 51 (FIG. 1) are disposed at predetermined locations in the beams 42a-42d.

The housing 21 is a rectangular enclosure that rests on the glass base 11. The mass 22 consists of a central mass 22b and four substantially rectangular outer masses 22a that extend in four directions from the corners of the central mass 22b. The mass 22 and glass base 11 are separated by a uniform space 61.

The peripheral frame 41 has a generally rectangular shape, matching the shape of the housing 21, from which the peripheral frame 41 is separated by the oxide film 31, except that the peripheral frame 41 also has a stopper 41a at each of its four corners. The four beams 42a, 42b, 42c, 42d (FIG. 1) extend inward from the middle of each side of the peripheral frame 41. The mass attachment section 43 consists of four outer mass attachment sections 43a overlying the four outer masses 22a and a central mass attachment section 43b overlying the central mass 22b. The four beams 42a, 42b, 42c, 42d extend from the central mass attachment section 43b over the spaces between the four outer masses 22a.

Each outer mass 22a is separated from its neighboring outer masses 22a, the housing 21, the glass base 11, and the stopper 41a by respective spaces 62, 64, 61, and 65. The outer mass attachment sections 43a are separated from the beams 42a, 42b, 42c, 42d, the peripheral frame 41, and stopper 41a by spaces 62, 64, and 66.

As the four regions 1a, 1b, 1c, 1d are mutually symmetrical with respect to the pair of orthogonal lines a, b, descriptions of regions other than region 1a will be omitted. In each region, the outer mass 22a is held by the outer mass attachment section 43a. Accordingly, the mass 22 is secured to the mass attachment section 43 through the oxide film 32 and held in a hollow space by the four beams 42a, 42b, 42c, 42d so that it can move freely.

The operation of the piezoresistive acceleration sensor 1 will now be described.

When the piezoresistive acceleration sensor 1 is accelerated, the mass 22 responds by changing position, thereby distorting the beams 42a, 42b, 42c, 42d. As a result, the resistance values of the piezoelectric resistive elements 51 disposed in the beams 42a, 42b, 42c, 42d change. The change in the resistance value of each piezoelectric resistive element 51 is detected by a bridge circuit configured with wiring not shown in the drawings. The acceleration applied to the piezoresistive acceleration sensor 1 is derived from the resulting resistance data.

If a silicon flake that has chipped off during dicing as described above is present in the space 65 between the outer mass 22a and the stopper 41a, as shown in FIG. 2, for example, the movable range of the mass 22 may be reduced, or the mass 22 may be immobilized. The distortion of the beams 42a, 42b, 42c, 42d is therefore limited or prevented, resulting in inaccurate detection of applied acceleration.

Next, a novel method of dicing the SOI wafer 100 into individual MEMS structures, in this case a plurality of piezoresistive acceleration sensors 1, will be described.

Figure 4:
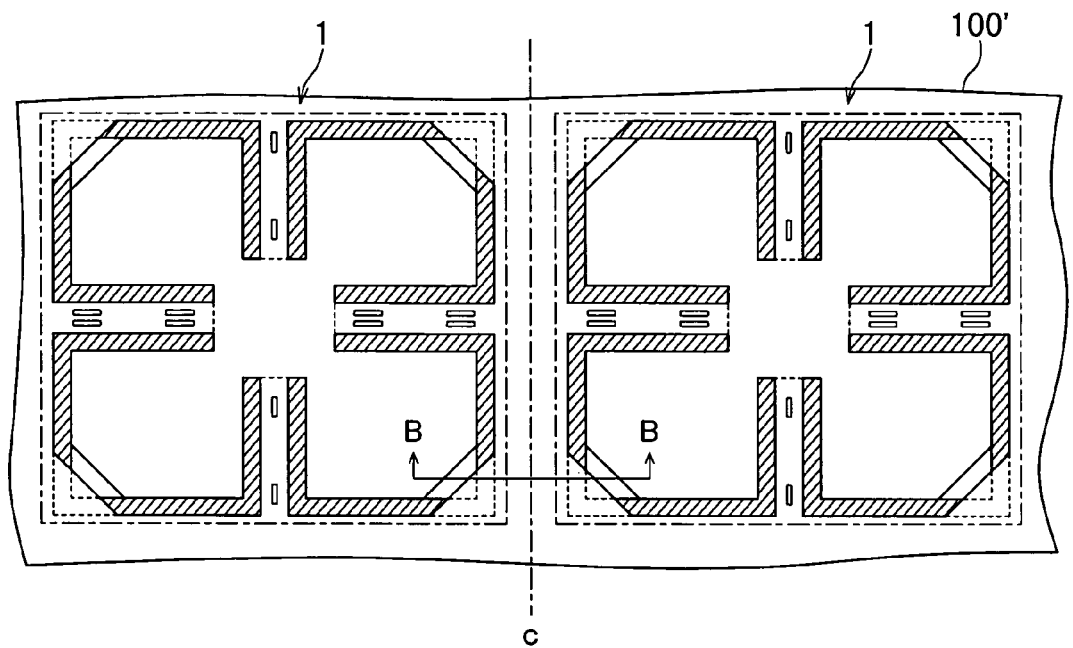
FIG. 4 is a plan view of a pair of piezoresistive acceleration sensors formed in the SOI wafer before dicing.

FIG. 4 shows two adjacent piezoresistive acceleration sensors 1 that have been formed in an SIO substrate 100', which is a part of the SIO wafer 100 before dicing. A scribe line (reference line) c is drawn as a virtual boundary between the two piezoresistive acceleration sensors 1. The dicing process will separate the piezoresistive acceleration sensors 1 from each other along this line.

Figure 5:
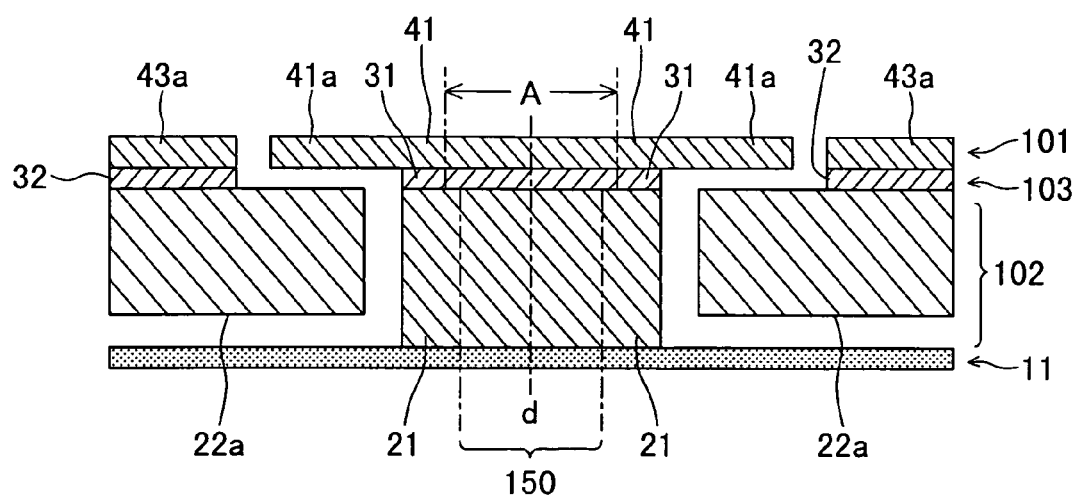
FIG. 5 is a partial schematic sectional view of the SOI wafer through line B-B in FIG. 4.

Before dicing, the housings 21, oxide films 31, and peripheral frames 41 in the adjacent piezoresistive acceleration sensors 1 are identical layers extending continuously across the scribe line c, as shown in FIG. 5, where the vertical centerline d between the two piezoelectric acceleration sensors is drawn at the same location as the scribe line c in FIG. 4. Reference numeral 150 indicates the zone of material that will be removed by the dicing saw to separate the adjacent piezoresistive acceleration sensors 1 into independent devices each having its own housing 21, oxide film 31, and peripheral frame 41.

A feature of the present invention is that the peripheral frames 41 are separated by etching a trench with a width A exceeding the width of the dicing zone 150. If necessary, the trench may extend through the oxide film 31, as shown. A piezoresistive acceleration sensor manufactured by the invented method is accordingly characterized by a housing 21 that extends outwardly slightly beyond the edges of the peripheral frame 41, or slightly beyond the edges of the peripheral frame 41 and oxide film 31.

Figure 6:
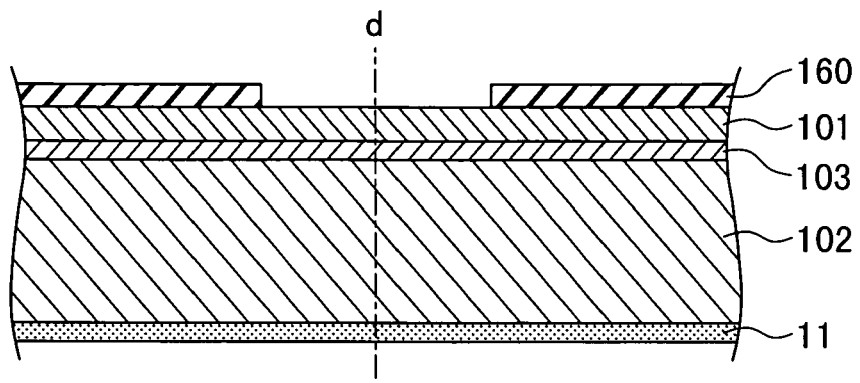
FIGS. 6 to 8 are partial sectional views of the wafer illustrating a novel sequence of wafer processing steps preparatory to dicing.

To create a trench of width A, in a novel wafer processing sequence preceding the dicing cut, the wafer is coated with a layer of photoresist material which is then patterned to remove the photoresist material from zones around the scribe lines (e.g., line c in FIG. 4 or line d in FIG. 5) and form a resist pattern 160, as shown in FIG. 6.

Figure 7:
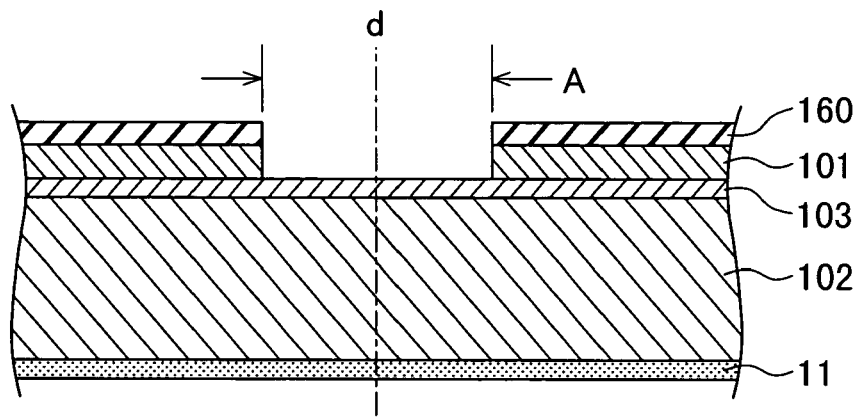

Next, as shown in FIG. 7, the part of the silicon active layer 101 exposed by the resist pattern 160 is dry-etched by use of a deep reactive ion etching (D-RIE) apparatus, the resist pattern 160 functioning as an etching mask. This etching step removes the full thickness of the active layer 101, excavating a trench of width A extending down to the BOX layer 103 along each centerline d. The trench width A, which is determined by the resist pattern 160, exceeds the width of the blade of the dicing apparatus that will be used later in the dicing process.

Figure 8:
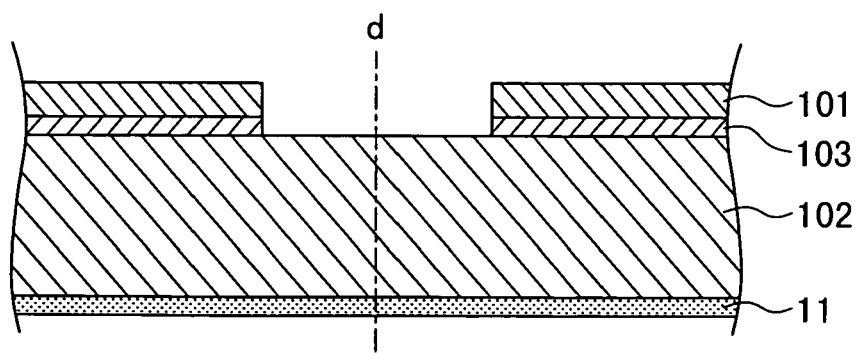

Next, the resist pattern 160 is ashed away as shown in FIG. 8, and the exposed oxide (part of the BOX layer 103) is removed by etching. This etching process may be omitted if it is not necessary to remove the oxide layer 103. This completes the wafer processing sequence.

Figure 9:
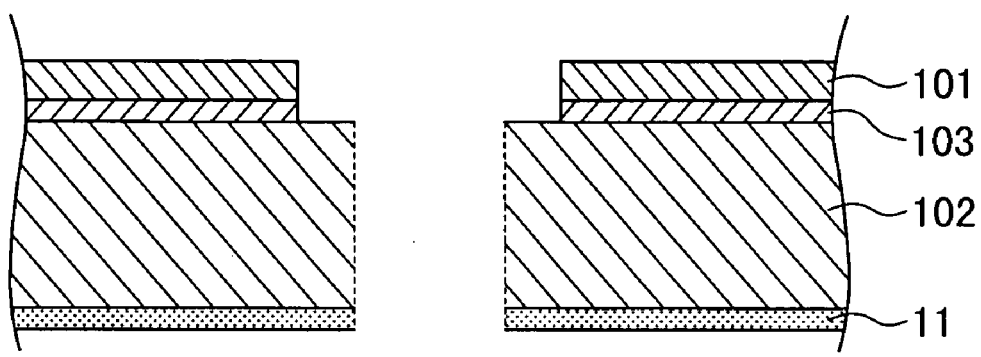
FIG. 9 is a partial sectional view of the wafer after a dicing cut.

The steps illustrated in FIGS. 6 to 8 may be carried out before, during, or after the formation of the MEMS structures. When the trenches and MEMS structures have both been completed, the wafer is separated into a plurality of MEMS chips by cutting through the silicon supporting layer 102 and the glass base 11 as shown in FIG. 9, using an ordinary dicing apparatus having a blade narrower than the trench width A.

Figure 10:
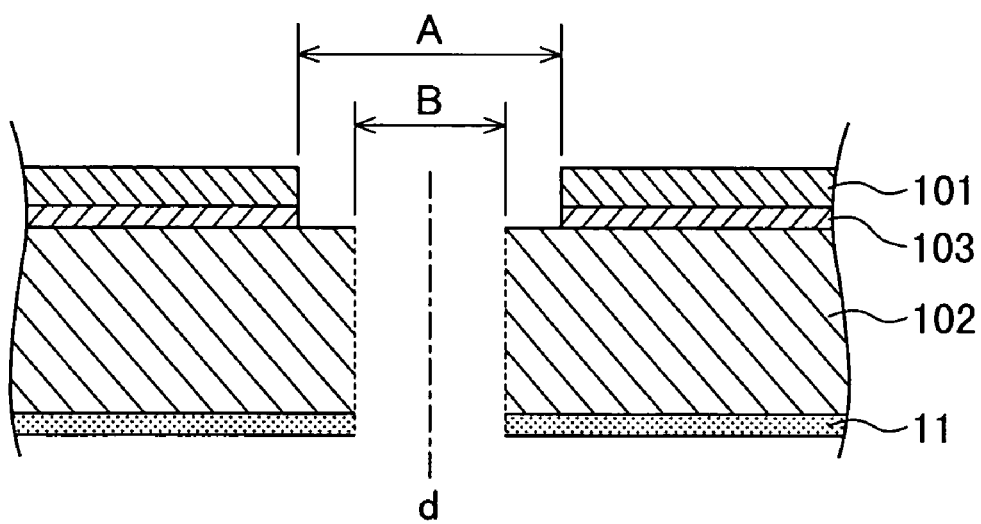
FIG. 10 illustrates dimensions related to the dicing cut.

Referring to FIG. 10, dicing is carried out so that the centerline d of the dicing cut matches the centerline d in FIG. 5. The width of the dicing cut is slightly greater than the width of the dicing blade. If the blade width is 70 μm, for example, the width B of the dicing cut can be expressed as $$B = 70 \text{ μm} + \alpha$$

where $\alpha$ is due to wobble etc. The value of $\alpha$ is normally much less than the blade width, so to a close approximation, $$B \approx 70 \text{ μm}.$$

If the trench width A is 120 μm, for example, then the trench width A exceeds the width B of the dicing cut by approximately 50 μm $$A = 120 \text{ μm} \approx B + 50 \text{ μm}$$

and the distance between each side of the blade and the silicon active layer 101 is approximately 25 μm.

As described above, this embodiment removes the silicon active layer of the SOI substrate by etching trenches surrounding the scribe lines, the trench width being greater than the width of the blade of the dicing apparatus. When the substrate is diced, the dicing blade follows the scribe lines and does make contact with the silicon active layer. The occurrence of chipping is thereby reduced even if the silicon active layer has a surface orientation that is particularly prone to chipping.

By reducing the occurrence of chipping as described above, this dicing method avoids malfunctions caused by chipped flakes of silicon that lodge in the internal spaces of the MEMS device, e.g., in the space 65 between the mass 22 and stopper 41*a* shown in FIG. 2. The invented dicing method thereby improves both production yields and reliability in the field.

The etching process in which the active layer of the SOI substrate is removed by selectively etching a trench centered on the scribe line can be performed concurrently with an etching process that forms electrical or mechanical components of the MEMS chips. For example, when the active layer is etched to form the spaces 62, 64, 66, the active layer can simultaneously be etched to form trenches centered on the scribe lines. That is, the spaces 62, 64, 66 and the trenches can be formed in the same etching step. The invention can therefore be practiced without additional fabrication steps, and can thus be expected to improve production yields without reducing the efficiency of the production process or significantly increasing its cost.

In the embodiment above, an SOI substrate consisting of a (110) silicon active layer rotated by 45 degrees with respect to a (100) supporting substrate layer is used, but the invention is not limited to this type of substrate; a different type of SOI substrate may be used.

Those skilled in the art will recognize that further variations are possible within the scope of the invention, which is defined in the appended claims.

What is claimed is:

1. A method of manufacturing a semiconductor device in a silicon on insulator (SOI) wafer having a silicon active layer, a supporting substrate layer, and a buried oxide (BOX) layer sandwiched between the silicon active layer and the supporting substrate layer, comprising:

forming a resist pattern as an etching mask on the silicon active layer;

performing a first etching process to selectively etch the silicon active layer using the etching mask to form a trench penetrating the silicon active layer and reaching the BOX layer, the trench being disposed along a scribe line with a predetermined width;

ashing the resist pattern after the first etching process;

after ashing the resist pattern, performing a second etching process to selectively etch the BOX layer exposed by the trench so that the trench extends to reach the supporting substrate layer; and cutting the supporting substrate layer along the scribe line by use of a dicing apparatus having a blade width smaller than the predetermined width.

2. The method of claim 1, wherein the selectively etching the silicon active layer comprises dry etching by use of a deep reactive ion etching apparatus.

3. The method of claim 1, wherein a plurality of microelectromechanical system (MEMS) structures are formed on the SOI wafer and the scribe line is formed in an area separating different ones of the plurality of MEMS structures from each other.

4. The method of claim 3, wherein the MEMS structures are piezoresistive acceleration sensors.

5. The method of claim 1, wherein after the first etching process an uppermost surface of the BOX layer forms a lowermost bottom surface of the trench.

6. The method of claim 1, wherein after the second etching process an uppermost surface of the supporting substrate layer forms a lowermost bottom surface of the trench.

* * * * *